United States Patent [19]
Kikuchi et al.

[11] Patent Number: 6,127,805
[45] Date of Patent: Oct. 3, 2000

[54] BATTERY CHARGE LEVEL DETECTING DEVICE

[75] Inventors: Yoshiaki Kikuchi; Toshiyuki Sekimori; Fumihiko Asakawa, all of Toyota; Yoshimi Shoji, Takahama; Kazuo Tojima; Masatoshi Uchida, both of Toyota; Susumu Ukita, Nagoya; Hiromichi Kuno, Aichi-ken, all of Japan

[73] Assignee: Toyota Jidosha Kabushiki Kaisha, Toyota, Japan

[21] Appl. No.: 09/168,073

[22] Filed: Oct. 8, 1998

[30] Foreign Application Priority Data

Oct. 13, 1997 [JP] Japan .................................... 9-278801

[51] Int. Cl.⁷ .................................. H02J 7/04; H02J 7/06
[52] U.S. Cl. ............................................ 320/132; 320/149
[58] Field of Search ................................. 320/104, 127, 320/132, 144, 149, 150, 153, 162, 163, DIG. 18, DIG. 19, DIG. 21; 324/427, 433

[56] References Cited

U.S. PATENT DOCUMENTS 5,325,041 6/1994 Briggs ......................... 320/DIG. 21 X
5,596,260 1/1997 Moravec et al. ............. 320/DIG. 21 X
5,596,262 1/1997 Boll .............................. 320/DIG. 21 X

FOREIGN PATENT DOCUMENTS 9-72948 3/1997 Japan .
9-171065 6/1997 Japan .

*Primary Examiner*—Edward H. Tso
*Attorney, Agent, or Firm*—Oliff & Berridge, PLC

[57] ABSTRACT

In the area of the charge level of 20~80% where the charge level of a battery does not appear in the terminal voltage of the battery, the battery ECU estimates charge level by integrating the currents of the charge and discharge of the battery. When the engine ECU detects that the ignition key is turned on, the motor generators are driven by the engine, and the generated electric power is accumulated in the battery. When the area where the charge level appears in the terminal voltage, is reached, the calculation of the charge level is performed from the current and voltage at that time. When this charge level has reached 80%, the calibration of said estimated charge level is performed by this value. Furthermore, it is also possible for this calibration to be prohibited when a heavy current is flowing and the error may become large in the calculation of the charge level. By the above mentioned methods, the charge level of a battery can accurately be detected.

7 Claims, 4 Drawing Sheets

BATTERY CHARGE LEVEL DETECTING DEVICE

BACKGROUND OF THE INVENTION

1. Field of the Invention

The present invention relates to a battery charge level detecting device for detecting the charge level of a secondary battery.

2. Description of the Related Art

An electric vehicle (including a hybrid electric vehicle) obtaining the total or a part of the driving force of the vehicle by an electric motor, has a secondary battery (hereafter, referred to simply as a battery) mounted on the vehicle, and by the electric power accumulated in this battery, said electric motor is driven. Regenerative braking is a characteristic function in such an electric vehicle. In regenerative braking, during vehicle braking, the kinetic energy of the vehicle is transformed into the electric energy by making said electric motor function as an electricity generator. The obtained electric energy is accumulated in the battery and is reused for acceleration or other vehicle needs. Accordingly, with regenerative braking, it is possible to reuse energy is normally radiated into the atmosphere as thermal energy in a conventional automobile which runs by an internal combustion engine alone, and the efficiency of the energy can considerably be improved.

Here, in order to effectively accumulate the electric power generated during regenerative braking in a battery, it is necessary for the battery to have a corresponding margin of capacity. Furthermore, in a type of hybrid electric vehicle in which the generator is driven by the heat engine mounted on the vehicle and generates the electric power and this electric power can be accumulated in a battery, the electric power accumulated in the battery, that is, the charge level can freely be controlled. Consequently, in such a hybrid electric vehicle, it is desirable that the charge level of a battery be controlled such that the charge level is approximately in the middle state (50~60%) between the state of full charge (100%) and the state of no charge (0%), so that the regenerative power may be received, and so that the electric power may be supplied to the electric motor immediately if a request is made. Accordingly, it is necessary to accurately detect the charge level of a battery.

Methods to detect the charge level of a battery on the basis of the terminal voltage of the battery are well known. However, during the charge or discharge, the terminal voltage changes with the value of the current, even when the charge level is the same. Therefore, the charge level of a battery cannot accurately be detected by the terminal voltage alone. Accordingly, if raising the detection accuracy of the charge level is desired, a method to detect the charge level on the basis of both the current flowing in the battery and the terminal voltage is used. Such a method to detect the charge level is disclosed in Japanese Patent Laid-Open Publication No. Hei9-72984.

Furthermore, depending on the type of a battery, there is a known battery in which the charge level does not affect the external characteristics of the battery in some area of the charge level, and in this case, a method to estimate the charge level by integrating the currents of the charge and discharge, is adopted.

SUMMARY OF THE INVENTION

A phenomenon that when a heavy current is continuously allowed to flow, the terminal voltage and apparent charge level are both lowered is well known. In such a case, if the detection of the charge level is performed, there has been a common problem that a value different from the actual charge level is detected. Furthermore, there has been a request to improve the accuracy of estimation even in the area where said charge level is found by estimation.

The present invention is made to solve the above mentioned problems, and an object is to raise the accuracy of detection of the charge level of a battery.

In order to solve the above mentioned problems, the battery charge level detecting device according to the present invention is a battery charge level detecting device which detects the charge level of a secondary battery having a first area of the charge level where the charge level of the secondary battery appears in the external characteristics of the secondary battery and a second area of the charge level where the charge level does not appear in the external characteristics. This device comprises a charge level estimating means for estimating the charge level in the second area of the charge level on the basis of the currents of the charge and discharge of the secondary battery; a charge level calculating means for calculating the charge level in the first area of the charge level on the basis of the external characteristics of the secondary battery; a charge level calibrating means for calibrating the estimated charge level by the calculated charge level when the charge level is in the first area of the charge level; a charge and discharge means which supplies the electric power to the secondary battery or consumes the electric power of the secondary battery; and a charge and discharge control means which judges the need of calibration of the charge level and controls the charge and discharge means so that the charge level of the secondary battery may be in the first area of the charge level if the need arises. Consequently, when it is considered that the error of the estimated value of the charge level has become large, by performing charge or discharge, the charge level is made to be in the first area of the charge level, so that the estimated value can be calibrated by the charge level obtained from the external characteristics of the battery.

Furthermore, the charge level calculating means can be arranged to calculate the charge level on the basis of the terminal voltage of the secondary battery and the current flowing in the secondary battery, and further, it can be arranged to perform the calculation of the charge level only in the case where said current is not more than a specified value. Consequently, the lowering of the accuracy of detection because of the lowering the apparent charging rate when a heavy current is allowed to flow, can be avoided.

Furthermore, it is possible that the charge and discharge control means includes a start-up detecting means for detecting the start-up of the charge and discharge means, and is arranged to control the charge and discharge means so that the charge level of the secondary battery may be in the first area of the charge level when the start-up of the charge and discharge means is detected. Consequently, even in the case where the charge level has decreased because of self discharge after not being used for a long term, the estimated charge level is calibrated, so that the accuracy of detection of the charge level can be raised.

Furthermore, the battery charge level detecting means can be arranged to include a prohibiting means, which prohibits the control of the charge and discharge control means in a case where the charge and discharge means was started and the elapsed time has not yet reached a specified time since the control was started so as to make the charge level of the secondary battery be in the first area of the charge level by using the charge and discharge control means. Consequently, the frequency for the charge and discharge means to be operated for the calibration can be restrained.

A further battery charge level detecting device of the present invention comprises a current detecting means for detecting the current flowing in the secondary battery; a voltage detecting means for detecting the terminal voltage of said secondary battery; a charge level calculating means which calculates the charge level of the secondary battery on the basis of the current and terminal voltage, only in the case where the current is not more than a specified value. Consequently, the calibrations of the estimated values of the charge levels are performed at proper intervals and the accuracy of estimation is improved.

Furthermore, it can be arranged that a temperature detecting means for detecting the temperature of the secondary battery is provided and the specified value of the current is determined according to the temperature of the secondary battery. Consequently, it is possible to deal with the lowering of the apparent charge level when a heavy current is allowed to flow, since that lowering depends on the temperature.

Furthermore, another battery charge level detecting device of the present invention may be in the form of a secondary battery charge level detecting device which detects the charge level of the secondary battery having a first area of the charge level where the charge level of the secondary battery appears in the external characteristics of the battery and a second area of the charge level where the charge level does not appear in the external characteristics. This configuration comprises a charge level estimating means for estimating the charge level in said second area of the charge level on the basis of the current of the charge and discharge of the secondary battery; a charge level calculating means for calculating the charge level in the first area of the charge level on the basis of the external characteristics of the secondary battery; and a charge level calibrating means which calibrates said estimated charge level by said calculated charge level, only in a case where the charge level is in the first area of the charge level and the current of the charge and discharge of the secondary battery is not greater than a specified value. Consequently, performing calibration of the charge level by a value when a heavy current flows and the calculation error of the charge level is large can be avoided, and, as a result, the detection accuracy of the charge level can be improved.

DESCRIPTION OF THE PREFERRED EMBODIMENT

Figure 1:
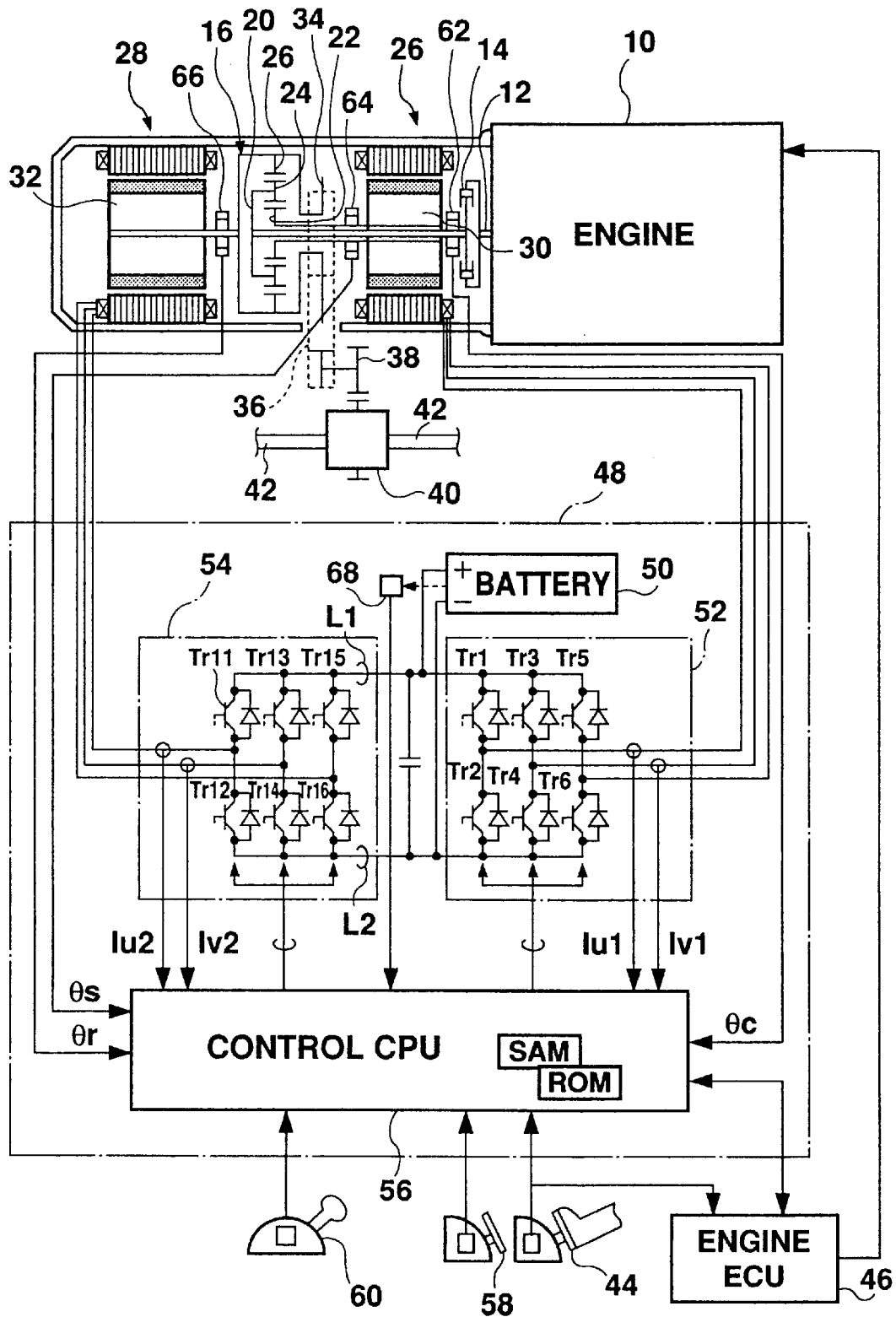
FIG. 1 shows the rough arrangement of the driving system of a hybrid electric vehicle.

An preferred embodiment of the present invention (hereafter, referred to simply as the embodiment) will be described below with reference to the drawings. In FIG. 1, a rough figure of a power plant of a vehicle to which a charge control device of the present invention is mounted, is shown.

To an output shaft 12 of an engine 10, a planetary carrier 20 supporting a planetary gear 18 of a planetary gear mechanism 16 is connected through a torsional damper 14. A sun gear 22 and a ring gear 24 of the planetary gear mechanism 16 are respectively connected to rotors 30, 32 of a first motor generator 26 and a second motor generator 28. The first and second motor generators 26, 28 function as a three-phase alternating current generator or a three-phase alternating current motor. To the ring gear 24, a power take-out gear 34 is further connected. The power take-out gear 34 is connected to a differential gear 40 through a chain 36 and a gear train 38. On the output side of the differential gear 40, a drive shaft 42 at the tip of which a driving wheel (not shown in the figure) is joined, is connected. By the above mentioned arrangement, the output of the engine 10 or the first and second motor generators 26, 28 is transmitted to the driving wheel, to drive the vehicle.

In the engine 10, the output power, the rotational speed, and the like thereof are controlled by an engine ECU 46 on the basis of the manipulated variable of an accelerator pedal 44, the environmental conditions such as cooling water temperature or intake manifold pressure, and further, the operational states of the first and second motor generators 26, 28. Furthermore, the first and second motor generators 26, 28 are controlled by a control device 48. The control device 48 includes a battery 50 (secondary battery) which supplies the electric power to two motor generators 26, 28 and receives the electric power from them. In the present embodiment, the battery 50 is a nickel hydrogen battery. The exchanges of the electric power between the battery 50 and the first and second motor generators 26, 28 are respectively performed through a first inverter 52 and a second inverter 54. The control of two inverters 52, 54 is performed by a control CPU 56, based on information of the operational state of the engine 10 from the engine ECU 46, the extent of operation of the accelerator pedal 44, the extent of operation of a brake pedal 58, the shift range determined by a shift lever 60, the state of charge of the battery, and further, the rotational angle θs of the sun gear, the rotational angle θc of the planetary carrier, and the rotational angle θ r of the ring gear of the planetary gear mechanism 16, and the like. Furthermore, the rotational angles of three components of said planetary gear mechanism 16 are respectively detected by a planetary carrier resolver 62, a sun gear resolver 64, and a ring gear resolver 66. The electric power accumulated in the battery, that is, the charge level is calculated by a battery ECU 68. The control CPU 56 controls transistors Tr1~Tr6, Tr11~Tr16 of the first and second inverters 52, 54 on the basis of the above mentioned various conditions and the u phase and v phase electric currents Iu1, Iv1, Iu2, Iv2 of the first and second motor generators 26, 28, and further, the electric currents L1, L2 supplied from or supplied to the battery or the inverter on the other side, and the like.

The rotational speed Ns of the sun gear, the rotational speed Nc of the planetary carrier, and the rotational speed Nr of the ring gear of the planetary gear mechanism 16 are related as shown by the following expression:

$$Ns = Nr - (Nr - Nc)(1+\rho)\rho \qquad (1)$$

where ρ is the gear ratio between the sun gear and the ring gear.

That is, if two of the three rotational speeds Ns, Nc, Nr are known, the remaining rotational speed can be determined. The rotational speed Nr of the ring gear is determined by the speed of the vehicle and, therefore, if either rotational speed of the rotational speed Nc of the planetary carrier, that is, the speed of the engine, or the rotational speed Ns of the sun gear, that is, the rotational speed of the first motor generator, is found, the other may be determined. Then, the field currents of the first and second motor generators 26, 28 are controlled according to the rotational speeds at that time, and whether these motor generators shall be operated as a generator or operated as a motor, is determined. If two motor generators 26, 28 consume the electric power as a whole, the electric power is brought out from the battery 50, and if they generate electricity as a whole, the battery 50 is charged. For example, when a decreasing charge level of the battery 50 is detected by the battery ECU 68, power generation may be performed by either or both of the two motor generators 26, 28 by using a part of the torque generated by the engine 10, and the charge to the battery 50 is performed. Furthermore, when the charge level of the battery 50 is increased, the output power of the engine 10 is a little restrained, and the second motor generator 28 is operated as a motor, and the torque generated by this is controlled so as to be used for the running of the vehicle. Furthermore, during the braking, either or both of the two motor generators 26, 28 are operated as generators, and the generated electric power is accumulated in the battery 50.

Since it is difficult to predict when the braking of an automobile will be performed, it is desirable that the battery 50 be in a state where the electric power generated by the regenerative braking can sufficiently be received. On the other hand, the battery 50 must be able to ensure a certain charge level for operating the second motor generator 28 as a motor when the output power of the engine 10 alone cannot achieve an acceleration desired by the driver. In order to fulfill this condition, the charge level of the battery 50 is controlled so as to be approximately one half of the battery capacity, that is, the maximum electric power which can be accumulated in the battery. In the present embodiment, the control is performed so that the charge level may be approximately 60%.

Especially, for a hybrid electric vehicle in which a battery can be charged by generating electricity with the output power of an engine, by properly controlling the charge level of a battery, the regenerative electric power during braking is sufficiently recovered and the energy efficiency is raised, and further, during acceleration, a desired acceleration can be achieved. In other words, in the case of the above mentioned hybrid electric vehicle, in order to raise the energy efficiency and in order to obtain a desired acceleration and the like, it is necessary to accurately detect and properly control the charge level of a battery.

Figure 2:
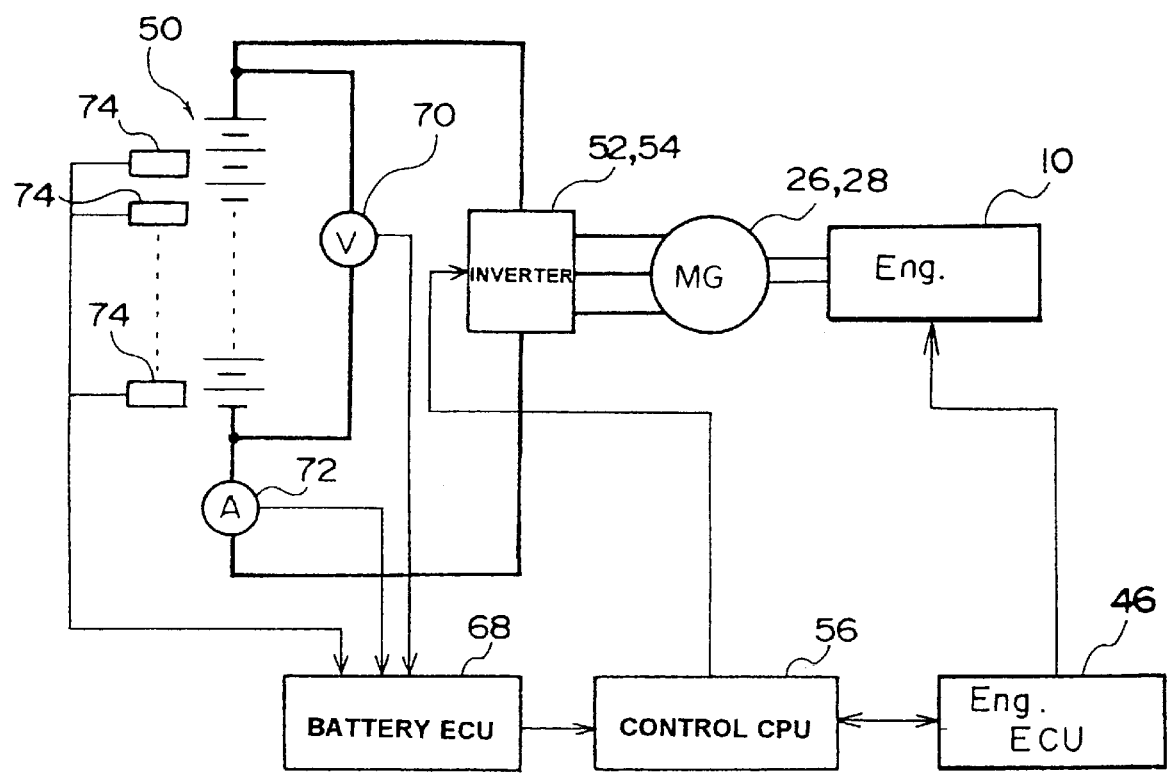
FIG. 2 shows the rough arrangement of an embodiment of the present invention.

In FIG. 2, the rough arrangement of the invention of the present embodiment is shown. In FIG. 2, components corresponding to those in FIG. 1 are given the same reference numbers. The battery 50 is a battery assembly having a plurality of cells arranged in series as shown in the figure, and is connected to motor generators 26, 28 through inverters 52, 54. The two motor generators 26, 28 are connected to the engine 10 through the transmission mechanism including the planetary gear mechanism. Furthermore, a voltage sensor 70 as a voltage detecting means for detecting the terminal voltage of the battery 50, and a current sensor 72 as a current detecting means for detecting the current flowing in the battery 50 are provided. Moreover, at a plurality of positions of the battery 50, temperature sensors 74 as temperature detecting means for detecting the temperature of the battery are provided. Temperature sensors 74 are provided at a plurality of positions because the temperature of the battery 50 differs depending on the positions. The outputs of the voltage sensor 70, the current sensor 72, and the temperature sensors 74 are sent to the battery ECU 68. In the battery ECU 68, the charge level of the battery is calculated on the basis of the obtained voltage and current, and further, the information relating to the temperature is sent out to the control CPU 56. The control CPU 56 integrates the data sent from the battery ECU 68 with various types of data of the engine ECU 46 or the like, and determines the operational states of the motor generators 26, 28, and performs the control of the inverters 52, 54 according thereto. As mentioned above, in a hybrid electric vehicle of the present embodiment, the electric power accumulated in the battery 50 is consumed by the motor generators 26, 28. Furthermore, the regenerative electric power by the motor generators 26, 28 and the electric power from the motor generators 26, 28 as generators driven by the engine, are supplied to the battery 50. Consequently, the motor generators 26, 28 and the engine 10 function as charge and discharge means which supply the electric power to the battery 50 and/or consume the electric power of the battery. Furthermore, the control CPU 56 which controls the motor generators 26, 28 through the inverters 52, 54, and the engine CPU 46 function as charge and discharge control means which control the charge and discharge means.

Figure 3:
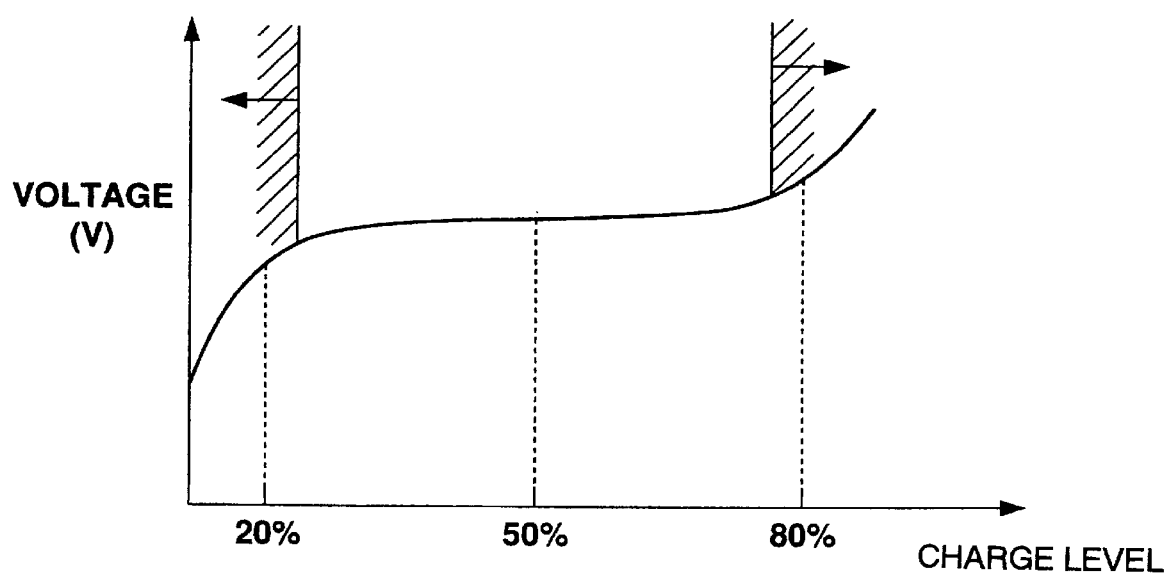
FIG. 3 shows the characteristic of the terminal voltage relative to the charge level of a nickel hydrogen battery.

In FIG. 3, the characteristic of the terminal voltage relative to the charge level of a nickel hydrogen battery used in the present embodiment, is shown. As shown in the figure, in the area where the charge level (SOC) is from slightly more than 20% to slightly less than 80%, the terminal voltage scarcely changes. On the other hand, when the charge level is less than 20% including the values near 20%, or in a case where the charge level is more than 80% including the values near 80%, if the charge level changes, this change appears as the terminal voltage, that is, as the external characteristic of the battery. Therefore, in the present embodiment, when the charge level of approximately not more than 20% and of the charge level of approximately not less than 80% where the charge level appears as the external characteristic, the detection of the charge level is performed on the basis of the terminal voltage and the current flowing in the battery. This method by which the charge level is calculated by the terminal voltage and the current, is hereafter expressed as the IV judgment, and this area is expressed as the IV judgment area. On the other hand, in the area where the charge level is between approximately 20% and approximately 80%, the charge level scarcely appears as the external characteristic of the battery, and therefore, the charge level is estimated by integrating the currents which have flowed in the battery. Hereafter, this area is expressed as the estimated area. These calculation and estimation of the charge level are performed in the battery ECU 68 on the basis of the outputs of the voltage sensor 70 and the current sensor 72, and consequently, the battery ECU 68 functions as an estimating means of the charge level and a calculating means of the charge level.

A battery used in a hybrid electric vehicle like the battery 50 of the present embodiment, is charged with the regenerative electric power and the electric power generated by using a part of the output of the engine. The battery is discharged to drive the motor generators 26, 28. Therefore, charge and discharge are repeated, and the charge level of the battery continuously changes. If this change of the charge level is within the estimated area, the battery ECU 68 integrates the amounts of current detected by the current sensor 72 to the initial value in turn, and estimates the charge level at that time. In this integration, the calculation is performed in such a way that the current during the charge is taken as plus and the current during the discharge is taken as minus. Between this estimated value and the actual charge level, a difference arises because of the fact that the charging efficiency changes with the environmental conditions such as the temperature and because of the self discharge during the time when the battery is left as it is for a long time, or the like.

Figure 4:
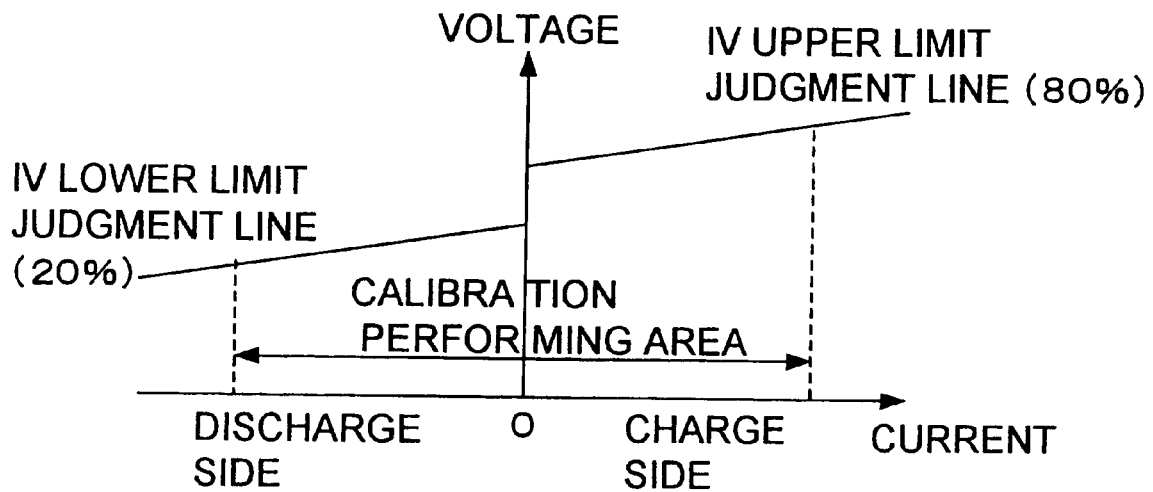
FIG. 4 shows one example of the IV judgment map.

In order to correct this difference, the calibration is performed in the following manner. When either charge or discharge is continuously performed and the charge level is estimated to have entered the IV judgment area, the battery ECU 68 reads in the value of the current and the value of the voltage from the current sensor 72 and the voltage sensor 70. These values are applied to the IV judgment map shown in FIG. 4. The IV judgment map is prepared by checking in advance the characteristics of the battery 50, and is stored in the storing area in the battery ECU 68. Therefore, the battery ECU 68 functions as an IV judgment map storing means. In which position of the IV judgment map the detected voltage and current exist, is calculated, and if it is during the discharge, the estimated value of the charge level is rewritten to 20% at the time when the terminal voltage has been decreased and has reached the IV lower limit judgment line, that is, at the time when the charge level has become 20%. Furthermore, if it is during the charge, the estimated value is rewritten to 80% at the time when the terminal voltage has been increased and has reached the IV upper limit judgment line, that is, at the time when the charge level has become 80%. Thus, the estimated value of the charge level is calibrated, and consequently, in this calibration control, the battery ECU 68 functions as a charge level calibrating means.

In a nickel hydrogen battery, when charging is performed with a heavy current, there is a tendency for the terminal voltage to be raised with the elapse of time. This exceeds the increase of the charge level caused by the performance of charge, and even if the original charge level is 80%, a higher charge level is calculated. In other words, even when the real charge level has not yet reached 80%, the charge level is judged to have reached 80%. There is also a similar phenomenon during discharge, and if discharge is performed with a heavy current, the terminal voltage is lowered with the elapse of time, and this lowering exceeds the lowering of the charge level caused by the discharge. Therefore, even if the real charge level is 20%, a lower charge level is calculated. In other words, even in a case where the real charge level has not yet reached 20%, the charge level is judged to have reached 20%. This tendency is especially remarkable at low temperatures. In order that such an error may not arise in the detection of the charge level and the calibration of the estimated value of said charge level by the apparent charge level during charge and discharge, in the present embodiment, the control CPU 56 is arranged to prohibit the detection of the charge level by the IV judgment and the calibration of said estimated value, when charge and discharge are performed with a heavy current. That is, the calibration of the estimated value of the charge level is performed only in the calibration performing area shown in FIG. 4. Furthermore, the range of this calibration performing area is changed on the basis of the temperature detected by the temperature sensor 74. In the present embodiment, this range gradually narrows when the temperature becomes below 0° C.

Figure 5:
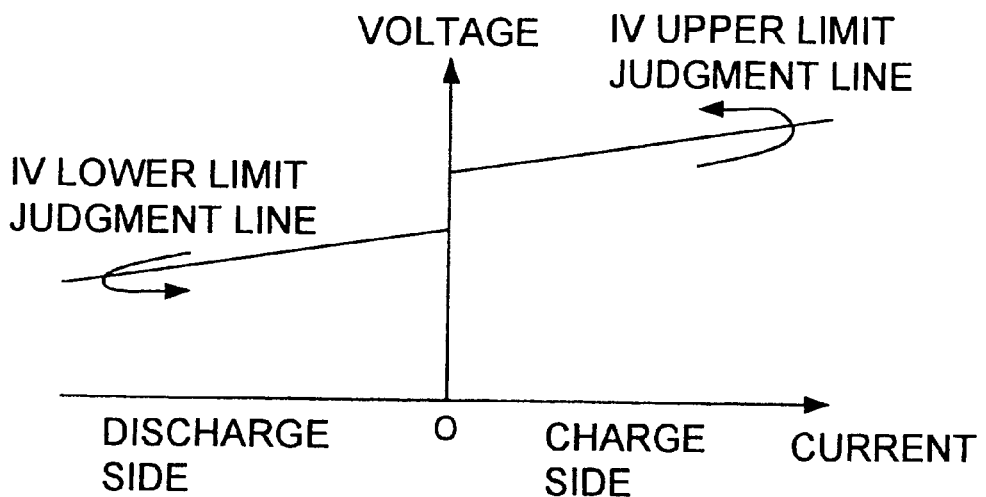
FIG. 5 shows the change of the voltage which arises when the current has been decreased while a heavy current flows in a battery.

In a nickel hydrogen battery it is well known that when charge and discharge are performed with a heavy current and this current gradually becomes smaller, the terminal voltage is shifted from the value showing the original charge level by charge polarization. As shown in FIG. 5, a high voltage is detected when the charge current is decreased, and a low voltage is shown when the discharge current is decreased. If the charge level is judged on this basis, there is a possibility that, even when the charge level has actually not yet reached 80% or 20%, the charge level may be misjudged to have reached these value. Therefore, the adoption of the data when d[I]/dt>0 (where [I] is the absolute value of the current I) is prohibited.

As described above, the calibration of the estimated value of the charge level is performed when the charge level detected by the IV judgment has reached 20% or 80%, but exclusively depends on the operational state of the vehicle that the charge level reaches said values. That is, when the regenerative electric power is generated to some extent and the consumption of the electric power by the motor generator is also proper, there are cases where the charge level does not reach 20% or 80% for a long time. Furthermore, in case such as when the vehicle is not used for a long period, there are times when the charge level stored in the battery ECU 68 from the last operational time may be changed through self discharge of the battery. In the present embodiment, when the vehicle is started, that is, when the ignition key is turned on, the engine ECU 46 starts the engine 10, and the control CPU 56 operates at least either of the motor generators 26, 28 as a generator, and the battery 50 is charged with this electric power. This changing is continued until the IV judgment upper limit line is reached, and at the time when this line is reached, the charge level is calibrated to be 80%. Furthermore, in a case where the temperature of the battery is high, the electricity generation of the motor generators 26, 28 is prohibited, and they are made to function as motors, so that the vehicle may run. Consequently, discharge is performed until the IV lower limit judgment line is reached, and, at the time when this line is reached, the charge level is calibrated to be 20%. Consequently, the estimated value of the charge level is fittingly calibrated, and it is arranged so that calibration will not be performed ad infinitum. Furthermore, the drift of the charge level due to self discharge in the state where the vehicle is not used is also corrected at this time. Furthermore, by driving the generator with the engine 10 at the time of start-up, a load can be given to the engine 10, and the operational time for warming-up can be decreased. Furthermore, the charge or discharge is performed, not only when the ignition key is turned on, but also when the above mentioned calibration control is not performed for a specified term, so that the estimated value of the charge level can be calibrated. Furthermore, the value of the current at this time is a value in the above mentioned calibration performing area.

Furthermore, in a vehicle used for purposes such as home delivery where the ignition key is often turned on and off, it is unnecessary to perform calibration control each time. Therefore, it is also possible to arrange that the above mentioned calibration is not performed when the time elapsed since the last turning on of the ignition key, has not yet reached a specified value.

Furthermore, it is also possible to arrange that, ever if a charge level of 80% is detected during the charge, the charge is continuously performed, so that the variation of the charge level for each cell included in the battery assembly 50 may be decreased. This is made by utilizing the property that when the charge level is increased, the charging efficiency is lowered and the charge level reaches the ceiling, and consequently, a cell with a low charge level catches up with a cell with a high charge level, and the difference thereof is reduced, and the variation is decreased.

As mentioned above, according to the present embodiment, the charge level of a battery can accurately be detected. Furthermore, by prohibiting the calibration according to the temperature of the battery, a false detection of the charge level because of the temperature of the battery can be prevented.

Furthermore, in the present embodiment, the description has been given by taking a battery mounted on a hybrid electric vehicle as an example, but the present invention can be applied to a battery of any applications. Furthermore, it can be applied not only to a nickel hydrogen battery of the present embodiment, but also to a lithium ion battery, a nickel cadmium battery, a lead battery, and the like.

What is claimed is:

1. A battery charge level detecting device which detects the charge level of a battery having a first range where the charge level of the secondary battery corresponds to a voltage level of the secondary battery and a second range where the charge level does not correspond to the voltage level of the secondary battery, comprising:
    a charge level estimating means for estimating the charge level of said second range based on the currents of the charge and discharge of the secondary battery;
    a charge level calculating means for calculating the charge level of said first range based on a terminal voltage level of the secondary battery;
    a charge level calibrating means for calibrating said estimated charge level by said calculated charge level when the charge level is in said first range;
    a charge and discharge device which supplies the electric power to the secondary battery or consumes the electric power of the secondary battery; and
    a charge and discharge control means which judges the need of calibration of the charge level and controls said charge and discharge device so that the charge level of said secondary battery may be in said first range when a need arises.

2. The battery charge level detecting device according to claim 1, wherein said charge level calculating means is arranged to calculate the charge level on the basis of the terminal voltage of the secondary battery and the current flowing in the secondary battery, and further, is arranged to perform the calculation of the charge level only in a case where said current is not more than a specified value.

3. The battery charge level detecting device according to claim 1, wherein said charge and discharge control means includes a start up detecting means for detecting the start up of said charge and discharge device, and is arranged to control said charge and discharge device so that the charge level of the secondary battery may be in said first range when the start up of said charge and discharge device is detected.

4. The battery charge level detecting device according to claim 3, comprising a prohibiting means which prohibits said control of said charge and discharge control means when said charge and discharge device is started before a specified time since the last control was performed so that the charge level of the secondary battery may be in said first range.

5. A battery charge level detecting device comprising:
    a current sensor for detecting the current flowing in a secondary battery;
    a voltage sensor for detecting the terminal voltage of said secondary battery; and
    a charge level calculating means which calculates the charge level of the secondary battery on the basis of said current and terminal voltage only in a case where said current is not more than a specified value.

6. The battery charge level detecting device according to claim 5, further comprising a temperature sensor for detecting the temperature of the secondary battery, wherein the specified value of said current is determined according to the temperature of the secondary battery.

7. A battery charge level detecting device which detects the charge level of a secondary battery having a first range where the charge level of the secondary battery corresponds to a voltage level of the secondary battery and a second range where the charge level does not correspond to the voltage level of the secondary battery, comprising:
    a charge level estimating means for estimating the charge level of said second range based on the current of the charge and discharge of the secondary battery;
    a charge level calculating means for calculating the charge level of said first range based on a terminal voltage level of the secondary battery; and
    a charge level calibrating means for calibrating said estimated charge level by said calculated charge level, only in a case where the charge level is in said first range and the current of the charge and discharge of the secondary battery is not more than a specified value.

* * * * *